(12) United States Patent
Diem

(10) Patent No.: US 7,790,615 B2
(45) Date of Patent: Sep. 7, 2010

(54) ELECTRONIC COMPONENT PACKAGING

(75) Inventor: Bernard Diem, Echirolles (FR)

(73) Assignee: Commissariat a l'Energie Atomique, Paris (FR)

( * ) Notice: Subject to any disclaimer, the term of this patent is extended or adjusted under 35 U.S.C. 154(b) by 649 days.

(21) Appl. No.: 11/459,187

(22) Filed: Jul. 21, 2006

(65) Prior Publication Data
US 2007/0077675 A1    Apr. 5, 2007

(30) Foreign Application Priority Data
Jul. 22, 2005    (FR) .................................. 05 52282

(51) Int. Cl.
*H01L 21/14* (2006.01)
*H01L 27/08* (2006.01)
*H01L 21/465* (2006.01)
*H01L 21/479* (2006.01)

(52) U.S. Cl. .................. 438/675; 438/629; 438/672

(58) Field of Classification Search .................. 438/411, 438/421, 629, 671, 675
See application file for complete search history.

(56) References Cited

U.S. PATENT DOCUMENTS 3,775,579 A * 11/1973 Burghart et al. .......... 219/85.18
5,589,082 A    12/1996 Lin et al.
5,668,033 A     9/1997 Ohara et al.
5,671,905 A *   9/1997 Hopkins, Jr. ........... 251/129.01
5,952,572 A     9/1999 Yamashita et al.
6,013,572 A *   1/2000 Hur et al. .................... 438/614
6,023,100 A *   2/2000 Tao et al. .................... 257/762
6,635,509 B1   10/2003 Ouellet
6,877,209 B1    4/2005 Miller et al.
2009/0098731 A1* 4/2009 Gan et al. ................... 438/667

FOREIGN PATENT DOCUMENTS

EP    1 433 740    6/2004

OTHER PUBLICATIONS

Liwei Lin, "MEMS Post-Packaging by Localized Heating and Bonding", IEEE Transactions on Advanced Packaging, vol. 23, No. 4, Nov. 2000, pp. 608-616.

* cited by examiner

*Primary Examiner*—Zandra Smith
*Assistant Examiner*—Pamela E Perkins
(74) *Attorney, Agent, or Firm*—Oblon, Spivak, McClelland, Maier & Neustadt, L.L.P.

(57) ABSTRACT

The invention relates to a method to seal a cavity, comprising a hole (6), comprising:
- the deposition on at least part of the cover, or an electrically conductive material (4, 5),
- the conveyance of part of this material by electro-migration into the hole (6) to form a plug (20).

Figure 1:
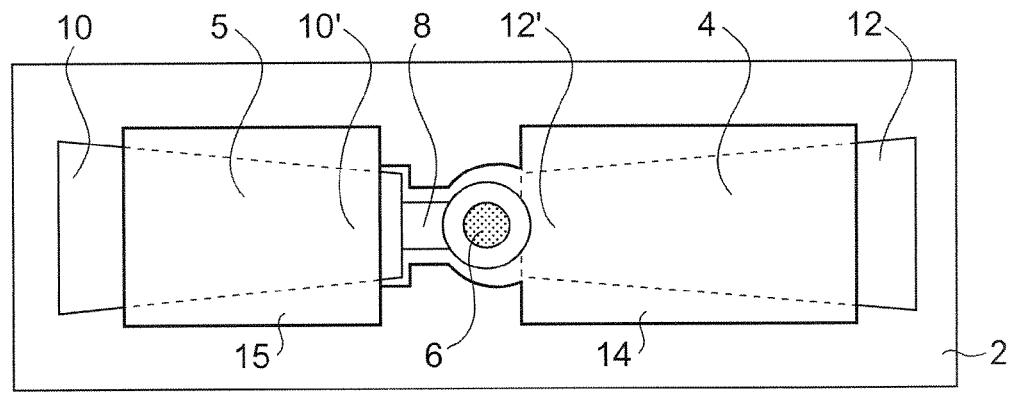

26 Claims, 1 Drawing Sheet

ELECTRONIC COMPONENT PACKAGING

FIELD OF THE INVENTION

The present invention relates to the production of a closed cavity, and particularly to the packaging, in a protected cavity, of electronic components that require a controlled environment with respect to the type of fluid or ambient pressure.

It particularly relates to Microsystems (MEMS) that have been made possible by micro-technology developments.

For example, numerous components and systems incorporate different types of sensors or actuators. These components are used for monitoring or measurement functions. These microcomponents, due to their small size or for operational reasons, need to be encapsulated in a controlled atmosphere (free from dust, or in neutral gas) or at well-controlled pressures (in vacuum or not).

Therefore, a sealing step is performed at the end of the production process, either on the basic component in a box, or on the substrate by means of collective processing.

Collective processing is preferred for cost reasons, but the present invention also relates to a single component.

Different techniques are known to perform this sealing.

According to a first technique, a cover (second substrate) is assembled in a vacuum for example by means of substrate assembly (also referred to as "wafer bonding"), or glass sintering, or eutectic formation, or anodic bonding. This technique uses up the surface to perform sealing around the sensitive component and requires the use of 2 substrates. Moreover, it is difficult to obtain a satisfactory vacuum with such a technique, described for example in the documents U.S. Pat. Nos. 5,668,033 or 5,952,572, as degassing of the seal occurs in the direct environment of the component.

According to another technique, a deposition of a layer is carried out to seal a hole associated with localised packaging: this deposition may be performed in a more or less high vacuum (vaporisation or sputtering), or at a low pressure by means of PECVD or LPCVD deposition. These depositions are performed overall on the entire substrate (or through a stencil if permitted by the technique) and require other subsequent operations to define the working area. The confined atmosphere and the residual pressure will depend on the technique used.

Attempts are frequently made to perform non-conforming deposition to prevent any deposition inside the cavity liable to disturb the microsystem. This condition is generally incompatible with the possibility to seal the hole. Such a technique is for example described in the documents U.S. Pat. Nos. 5,589,082, and 6,635,509.

Another technique consists of performing local sealing with an external supply of material: a bead of material is mounted on the hole to be sealed. After the bead has been heated and melted, the hole is sealed. This operation is generally not collective and requires heating over the bead melting point.

As above, it is difficult to control the pressure inside the cavity, as explained in the article by L. Lin, "MEMS Post Packaging by Localized Heating and Bonding", IEEE TRANSACTIONS ON ADVANCED PACKAGING, Vol. 23, No. 4, pp. 608 Nov. 2000.

In any case, it is very difficult to control the pressure inside the cavity, due to the process used and/or the process temperature.

However, for some resonator type components, it is important to have a high vacuum—or a controlled pressure—inside the cavity, to obtain a satisfactory quality coefficient.

Therefore, it is necessary to find a new method to produce an encapsulated electronic device which does not involve all or part of the drawbacks presented above.

In fact, the purpose of the invention is to be able to seal the orifice of a cavity, for example of a cover of an electronic device, at variable pressures, from a very high vacuum to several atmospheres, this sealing possibly being performed at a low temperature.

DESCRIPTION OF THE INVENTION

According to the invention, a displacement of material by means of electro-migration is used to supply the material required locally to seal a hole in order to seal a cavity comprising said hole. In addition, the conveyance phenomenon may be amplified if required, for example, by the presence of passivation layers.

The displacement of material by means of electro-migration, i.e. induced by applying a current, is generally considered as a parasitic phenomenon which corrodes metal connections and therefore should be minimised.

Therefore, the method according to the invention surprisingly uses this phenomenon.

The invention particularly relates to a method to seal or close a cover or a substrate, comprising a hole or an opening, comprising:

the deposition on at least part of the cover or substrate of an electrically conductive material, the conveyance of part of this material by electro-migration into the hole or opening, in order to form a plug.

In the cavity, an electronic component, for example an MEMS type microsystem, or a resonator or an accelerometer, may be positioned.

The electrically conductive material may for example be copper, or aluminium, or silver, or indium, or tin, or lead, or magnesium.

This material will have been deposited and engraved beforehand to obtain a sufficient quantity of material. By applying an electrical current (for example on tracks previously defined on the conductive material), the material will be displaced in the direction of the hole to be sealed and moved to said hole.

The material may be deposited beforehand by means of vacuum vaporisation or cathode sputtering.

For example, the hole has a maximum size or a diameter between 0.5 µm and 5 µm, the range of diameters or sizes enabling the use of the method under the best possible conditions.

The thickness of the electrical conductive material deposited may be between 0.1 µm and 5 µm, a range which is again favourable for an optimum method.

The electro-migration step may take place at temperatures between 150° C. and 300° C., for example 200° C.

A deposition step of an interface protection layer, except around the hole or the orifice, may be performed prior to electro-migration.

Preferentially, the electro-migration step is performed by means of a current flow, which is cut off after the formation of the plug due to the lack of conductive material outside the area forming the plug. In this way, the phenomenon is self-regulated: while the plug is not complete, current flows. This flow is stopped when the plug is formed.

The sealing or closure of the hole or opening may be performed in a vacuum, or at a non-zero pressure, for example between 0.5 bar and 1.5 bar. In fact, the pressure is selected in this way according to requirements in the cavity delimited by the cover or by the walls delimiting the environment of the component.

The electro-migration operation may be performed at the desired pressure (high vacuum or not) and at a relatively low temperature, for example around 200° C., to optimise the transfer and reduce the operation time.

As the material displacement used within the scope of the invention is performed by electro-migration, under the effect of the electron flow, without any chemical reaction and without requiring a special environment, it can be performed under optimum pressure, temperature or atmosphere conditions according to requirements.

The invention also relates to an electronic device comprising an electronic component sealing cavity, comprising a hole, wherein a component is positioned, and comprising:
  on at least part of the cavity, a layer of electrically conductive material,
  a plug, made of the same material, sealing or blocking a hole.

The electrically conductive material may be copper, or aluminium, or silver, or indium, or tin, or lead, or magnesium.

The thickness of the electrically conductive material deposited may be between 0.1 µm and 5 µm.

In addition, a device according to the invention may comprise an interface protection layer, except around the hole.

The cavity may be in a vacuum, or at non-zero pressure, for example between 0.5 bar and 1.5 bar.

DETAILED DESCRIPTION OF SPECIFIC EMBODIMENTS

An example of the method according to the invention will be described with reference to FIGS. 1-3.

A component, for example a microsystem (represented schematically in FIG. 2 by the reference 30) and a protective cover 22, 24 are produced on a substrate 2.

This cover defines, with walls 23, 25, a cavity wherein the component is isolated.

Hereinafter a single component will be mentioned, but the invention also relates to several components inserted in the cavity.

Figure 2:
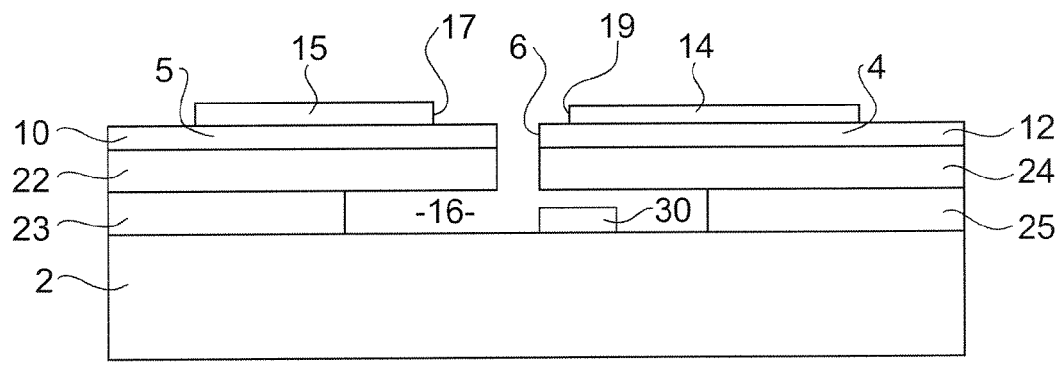
Figure 3:
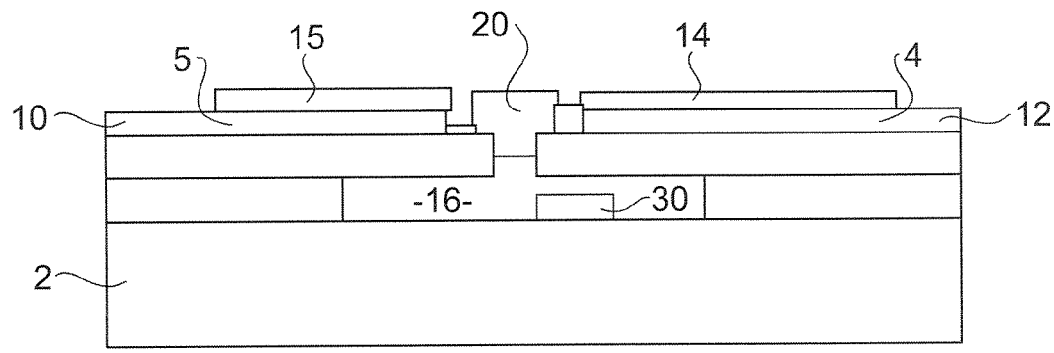

The inside 16 of the cavity may be released via one or more holes such as the hole 6 (FIGS. 1 and 2). This release step comprises for example selective engraving of a sacrificial layer, defined previously (for example made of SiO2 oxide or a polymer such as polyimide or BCB). This sacrificial layer may be that wherein the walls 23 and 25 are formed. In this case, the engraving time is controlled to release a specific surface area.

The hole 6 may have a diameter, or a maximum size measured in a plane parallel with the substrate 2, between 0.5 µm and 5 µm. For example, it is 2 µm in diameter. The greater the diameter, the more material needs to be displaced by electro-migration in order to seal it.

Not far from the orifice 6 to be closed, a layer 4, 5 of electrically conductive material, favourable for electro-migration, is formed. It may be engraved, in a form enabling the concentration of the growth of the material around the hole, during electro-migration.

This material is made for example of copper, or aluminium or silver, or indium, or tin, or lead, or magnesium.

Current supplies 10, 12 are provided and produced in this electro-migration layer, preferentially at its ends. Current flow tracks may also be defined on the layers 4, 5.

The current supplies 10, 12 may, as illustrated in FIG. 2, be formed by an extension of the layer 4, 5 on either side, to the outside of the device, the layer retracting inwards, in the vicinity of the hole 6, in the zones 10', 12' which increases the current density, and therefore the electro-migration phenomenon, to concentrate this phenomenon in the desired zone.

The electro-migration phenomenon may also be very sensitive to interfaces. Therefore, the surfaces of the layers 4 and 5 may be protected by a very adherent insulating layer 14, 15 (for example: $SiO_2$, or $Si_3N_4$, etc.) except around the orifice 6 to enable the effect and accumulation of material by means of electro-migration. Preferentially, this layer stops in the vicinity of the hole 6, but not just around the hole. This is illustrated in detail in FIG. 2, wherein the references 17, 19 refer to a rupture in the layer 14, 15, in the vicinity of the hole 6.

The layer(s) 14, 15, made of insulating material, is/are used to protect the conductive material/air (or ambient atmosphere) interface; they are also used, at the point 17, 19 where this layer stops (where it is engraved) to create a stress gradient which favours the material accumulation phenomenon.

The current supplies near the orifice 6 (for example the zone 8) may be designed so that the material transfer automatically stops conduction after the hole has been sealed: in this case, the material no longer closes the circuit supplying the current from one supply 12 to the other supply 10.

A current is injected with a density making it possible to obtain, around the hole 6, a local material electro-migration effect, with aggregation on and/or in the hole to be sealed. The current density is preferentially at least equal to 1 $MA/cm^2$, for example between 3 $MA/cm^2$ and 5 $MA/cm^2$, so that the rate of the electro-migration phenomenon is compatible with an industrial process. To favour this effect and reduce the electro-migration treatment time, the whole may be heated to temperatures of approximately 250° C. to 300° C.

The greater the current amplitude or density, the shorter the duration of the electro-migration phenomenon to seal the hole.

The material displacement is induced by applying an electric current in the layer 4, 5. This phenomenon is the result of the modification of the autodiffusion process into directional diffusion, oriented by the transfer of part of the quantity of electron movement to the diffusing ions. Volume, and/or surface, and/or intergranular, and/or dislocation and/or interface diffusion of the material of the layers 4, 5 may be obtained.

Depending on the atmosphere present during the electro-migration operation, it is found inside the cavity after sealing: if the operation is performed in a vacuum, there will be a corresponding vacuum in the cavity 16, if the operation is performed under pressure, the same pressure will be applied in the same cavity.

For example, for a resonator type component 30, it is desirable to seal the hole 6 in an optimum vacuum.

According to another example, for a component requiring viscous damping (for example an accelerometer), the sealing will be performed at non-zero pressure, atmospheric for example, or between 0.5 bar and 1.5 bar.

In addition, various factors may be optimised to favour electro-migration, particularly the current density, and/or the interfaces, and/or the particle size, and/or the temperature, and/or the mechanical stress. For example, these conditions may be deduced from the thesis by P Waltz, December 1998: "analyse et modélisation de la tenue à l'électro-migration des interconnexions en régime dynamique", with a view to the present application which is not described in this document.

The presence of a passivation layer 4, 5, renders the metal layer less sensitive to electro-migration in the zones wherein this passivation layer is present. Therefore, a passivation layer favours electro-migration in the zones wherein it is not present. In addition, a stress gradient is created in the rupture zones such as the zones 8, 17 and 19, where the passivation layer is no longer present, this gradient favouring electro-migration.

The particle size of the metal layers 4, 5 selected will preferentially be less than 0.5 μm or between 0.5 μm and 3 μm. The electro-migration effect is favoured for small grain sizes.

After the formation of the plug 20, an electronic device comprising a sealing cavity of an electronic component 30, comprising a hole 6, wherein the component 30 is positioned, is obtained, and comprising:
   on at least part of the cavity, a layer 4, 5 of electrically conductive material,
   a plug 20, made of the same material, sealing or obstructing a hole 6.

Any potential protective layers 14, 15 remain on the layers 4, 5.

In this way, the component 30 is encapsulated under the desired conditions. This component may have its own connections, different to the layer 12 (however, the type of material of this layer 12 may be identical to that of the material of these connections).

The invention claimed is:

1. An electronic device comprising a sealing cavity of an electronic component, including a hole, wherein the electronic component is positioned inside the sealing cavity, the electronic device comprising:
   on at least part of the cavity, a layer of electrically conductive material including at least two electrical conduction tracks, the layer of electrically conductive material subject to electro-migration, and
   a plug, including said electrically conductive material, sealing or blocking a hole disposed between the at least two electrical conduction tracks.

2. The device according to claim 1, comprising an electronic component in the cavity.

3. The device according to claim 2, wherein the electronic component is an MEMS type microsystem.

4. The device according to claim 2, wherein the electronic component is a resonator or an accelerometer.

5. The device according to claim 1, wherein the hole has a diameter between 0.5 μm and 5 μm.

6. A device according to claim 1, wherein the electrically conductive material is copper, or aluminium, or silver, or indium, or tin, or lead, or magnesium.

7. A device according to claim 1, wherein the thickness of the electrically conductive material is between 0.1 μm and 5 μm.

8. A device according to claim 1, further comprising an interface protection layer, on at least part of the conductive material, except around the hole.

9. A device according to claim 1, wherein the electronic component is an MEMS type microsystem.

10. A device according to claim 1, wherein the electronic component is a resonator or an accelerometer.

11. A device according to claim 1, wherein the cavity is produced in a vacuum.

12. A method to seal a cavity, initially comprising at least one hole, comprising:
   depositing an electrically conductive material on at least part of the cavity,
   defining at least two electrical conduction tracks on the electrically conductive material, and
   conveying part of said electrically conductive material by electro-migration into the hole to form a plug after defining the at least two electrical conduction tracks.

13. A method according to claim 12, wherein said depositing and conveying are performed in a non-zero pressure between 0.5 bar and 1.5 bar.

14. A method according to claim 12, comprising positioning an electronic component in the cavity.

15. A method according to claim 14, wherein the electronic component is an MEMS type microsystem.

16. A method according to claim 14, wherein the electronic component is a resonator or an accelerometer.

17. A method according to claim 12, wherein the electrically conductive material is deposited by vacuum vaporisation or cathode sputtering.

18. A method according to claim 12, wherein the hole has a diameter between 0.5 μm and 5 μm.

19. A method according to claim 12, wherein the thickness of the electrically conductive material deposited is between 0.1 μm and 5 μm.

20. A method according to claim 12, comprising performing the electro-migration at a temperature between 150° C. and 300° C.

21. A method according to claim 12, comprising performing the electro-migration comprises injecting a current at a density at least equal to 1 Mega-Ampere/cm$^2$.

22. A method according to claim 12, comprising performing the electro-migration comprises injecting a current at a density between 3 Mega-Amperes/cm$^2$ and 5 Mega-Amperes/cm$^2$.

23. A method according to claim 12, further comprising depositing, on at least part of the conductive material, an interface protection layer, except around the hole.

24. A method according to claim 12, comprising performing the electro-migration with a current flow, cut off after forming the plug.

25. A method according to claim 12, wherein said depositing and conveying are performed in a vacuum.

26. A method according to claim 12, wherein said depositing and conveying are performed in a non-zero pressure between 0.5 bar and 1.5 bar.

* * * * *